(12) United States Patent
Kim et al.

(10) Patent No.: US 6,518,624 B2
(45) Date of Patent: Feb. 11, 2003

(54) TRENCH-GATE POWER SEMICONDUCTOR DEVICE PREVENTING LATCH-UP AND METHOD FOR FABRICATING THE SAME

(75) Inventors: Hyun-chul Kim, Shihung (KR); Chong-man Yun, Seoul (KR); Kyu-hyun Lee, Bucheon (KR); Ju-il Kim, Bucheon (KR)

(73) Assignee: Fairchild Korea Semiconductor Ltd., Puchon (KR)

( * ) Notice: Subject to any disclaimer, the term of this patent is extended or adjusted under 35 U.S.C. 154(b) by 0 days.

(21) Appl. No.: 09/734,016

(22) Filed: Dec. 12, 2000

(65) Prior Publication Data

US 2002/0005548 A1 Jan. 17, 2002

(30) Foreign Application Priority Data

May 30, 2000 (KR) .............................. 00-29298

(51) Int. Cl.$^7$ .............................................. H01L 29/76
(52) U.S. Cl. ...................... 257/330; 257/328; 257/331; 257/401
(58) Field of Search ................................ 257/328–334, 257/401; 438/268–274

(56) References Cited

U.S. PATENT DOCUMENTS

| | | | | |
|---|---|---|---|---|
| 5,072,266 A | * | 12/1991 | Bulucea et al. ............ | 357/23.4 |
| 5,468,982 A | * | 11/1995 | Hshieh et al. ............... | 257/331 |
| 5,545,908 A | * | 8/1996 | Tokura et al. ............... | 257/341 |
| 5,895,952 A | * | 4/1999 | Darwish et al. ............. | 257/330 |
| 5,910,669 A | * | 6/1999 | Chang et al. ................ | 257/339 |
| 6,005,271 A | * | 12/1999 | Hshieh ........................ | 257/341 |

FOREIGN PATENT DOCUMENTS

JP       11-87690    *   3/1999   ........... H01L/29/74

* cited by examiner

*Primary Examiner*—Steven Loke
*Assistant Examiner*—Ori Nadav
(74) *Attorney, Agent, or Firm*—Rothwell, Figg, Ernst & Manbeck

(57) ABSTRACT

A trench-gate power semiconductor device and a method for fabricating the same are provided. The trench-gate power semiconductor device includes a semiconductor substrate of a first conductivity type used as a collector region, a buffer layer of a second conductivity type formed on the semiconductor substrate, a drift region of a second conductivity type formed on the buffer layer, a base region of a first conductivity type formed on the drift region, a gate dielectric layer formed on the surface of a trench which is formed down to a predetermined depth into the drift region and surrounds the base region, a gate electrode formed on the gate dielectric layer, an emitter region of a second conductivity type contacting both the surface of the base region and an upper sidewall of the trench in the base region, the emitter region contains a first emitter region formed so as to be extended to a predetermined length along the sidewall of the trench and to be alternately arranged in the base region and a second emitter region extended to a predetermined length from the first emitter to the center of the base region, an emitter electrode formed so as to be electrically connected to the first emitter region through a part of the second emitter region, and a collector electrode formed so as to be electrically connected to the semiconductor substrate.

6 Claims, 13 Drawing Sheets

☐ PARTS OF THE BASE REGION
▨ EMITTER REGIONS

TRENCH-GATE POWER SEMICONDUCTOR DEVICE PREVENTING LATCH-UP AND METHOD FOR FABRICATING THE SAME

BACKGROUND OF THE INVENTION

1. Field of the Invention

The present invention relates to a power semiconductor device and a method for fabricating the same, and more particularly, to a trench-gate power semiconductor device preventing latch-up and a method for fabricating the same.

2. Description of the Related Art

In general, in a power semiconductor device used in high voltage applications, it is very important to prevent latch-up, which causes turn-on of a parasitic transistor existing inside the power semiconductor device. Latch-up can be largely classified into a static latch-up and a dynamic latch-up. The static latch-up is a phenomenon that occurs when a junction between a base region and an emitter region is forward biased during a high current operation in a device in a state in which a voltage is applied to the gate of the device. The dynamic latch-up is a phenomenon that occurs when an impurity type is inverted in an inversion layer during voltage-applied switching at a time when a voltage is applied to a gate or the voltage is removed from the gate, or a phenomenon that occurs due to a displacement current in the base region in a breakdown mode.

Figure 1:
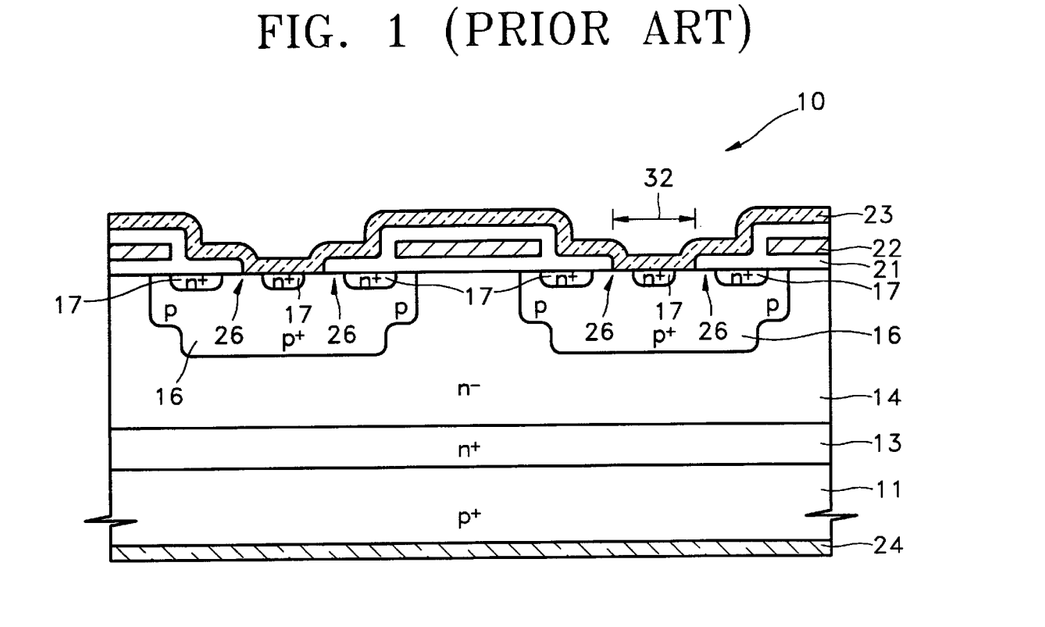
FIG. 1 is a sectional view of a conventional power semiconductor device for preventing latch-up.

FIG. 1 is a sectional view of a conventional power semiconductor device employing a ballast resistor for preventing latch-up.

As shown in FIG. 1, the power semiconductor device is, for example, an insulated gate bipolar transistor 10, realized by a planar process, and the insulated gate bipolar transistor 10 includes a semiconductor substrate 11 formed of a material having first conductivity type impurities, for example, a p-type semiconductor material. A material having second conductivity type impurities, for example, an n-type buffer layer 13 is arranged on the semiconductor substrate 11. A semiconductor layer 14 used as a drift region is formed on the buffer layer 13. Although the semiconductor layer 14 also has n-type impurities like the buffer layer 13, the impurity concentration of the semiconductor layer 14 is lower than that of the buffer layer 13. P-type base regions 16 extended from part of the upper surface of the semiconductor layer 14 are formed in part of the semiconductor layer 14. The base regions 16 are formed to be horizontally spaced-apart from one another.

N-type emitter regions 17 with high concentration are formed by being extended from the upper surface of the semiconductor layer 14 in part of the base regions 16. An inversion layer is formed between the edges of the emitter regions 17 and the base regions 16. A gate electrode 22 is insulated from the semiconductor layer 14 by a gate dielectric layer 21. An emitter electrode 23 is formed to be electrically connected to the emitter regions 17 in emitter contact openings 32. A collector electrode 24 is formed to be electrically connected to the semiconductor substrate 11.

Figure 2A:
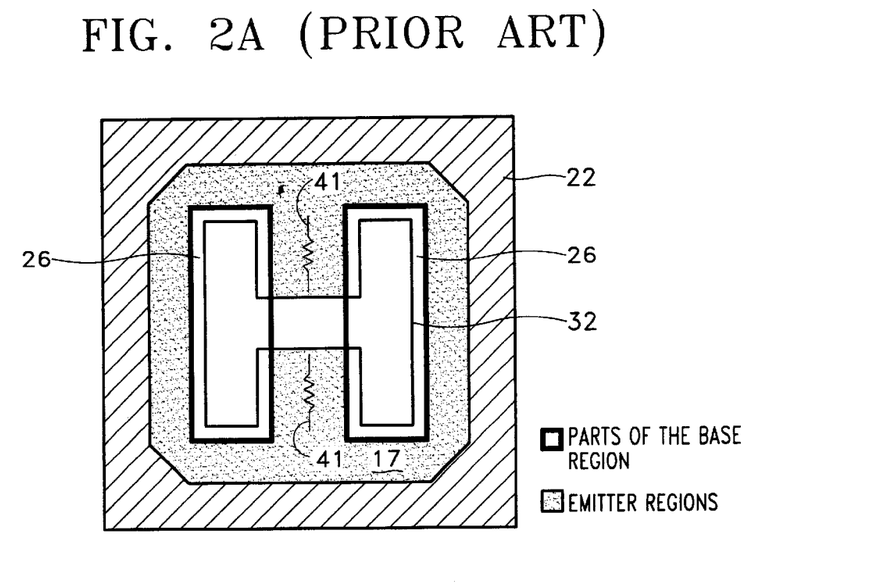
FIGS. 2A through 2C are lay-out views illustrating configurations of emitter regions and a part of a base region in an upper surface in the power semiconductor device of FIG. 1.
Figure 2B:
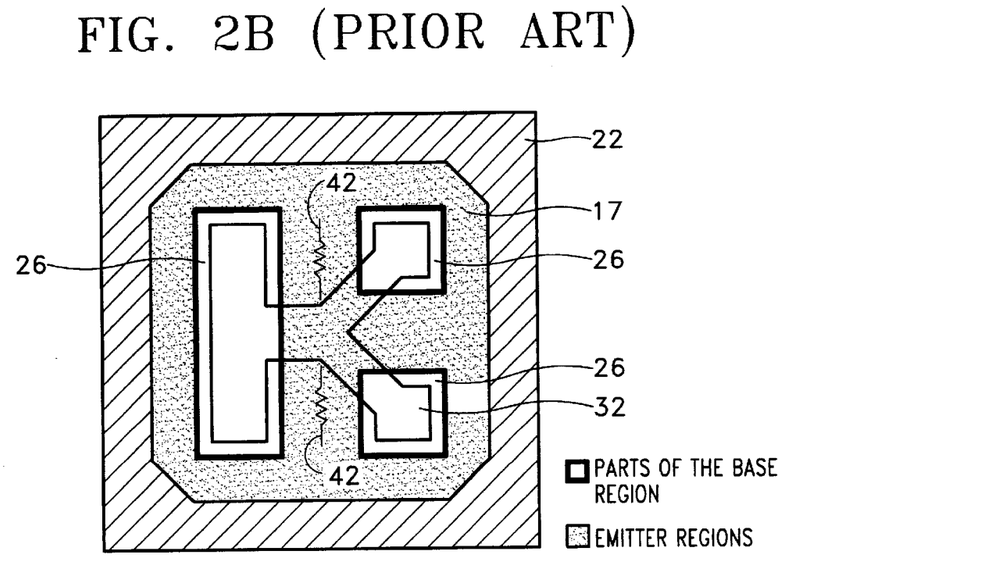
Figure 2C:
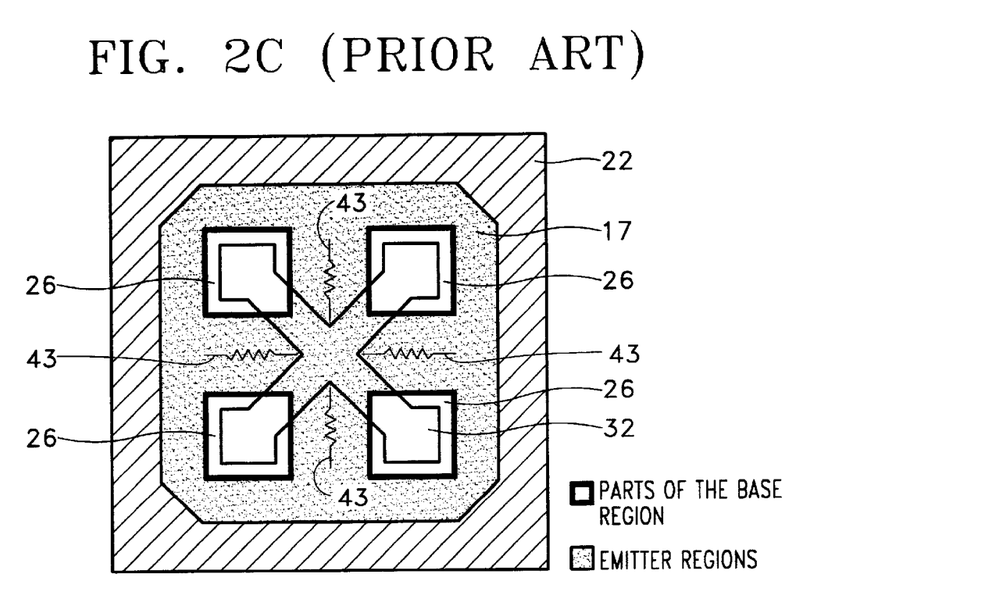

FIGS. 2A through 2C are lay-out views illustrating configurations of emitter regions and parts of base regions on the upper surface of the power semiconductor device of FIG. 1. The same reference numerals as shown in FIG. 1 denote the same region or layer. Thus, in order to avoid redundancy, a description thereof will be omitted.

First, referring to FIGS. 2A through 2C, a gate 22 is formed in a shape having an opening at its center. In the lay-out of FIG. 2A, parts 26 of the base region 16 include two adjacent regions surrounded by the emitter regions 17. Ballast resistors 41 are formed in the emitter regions 17 between the two adjacent parts 26 of the base region 16. The ballast resistors 41 prevent turn-on of a parasitic transistor by preventing the junction between the base region 16 and the emitter regions 17 from being forward biased. In the lay-out of FIG. 2B, emitter contact openings 32 are formed in a "K" shape, and the parts 26 of the base region 16 include three separate regions. The emitter regions 17 surround the separate regions of the parts 26 of the base region 16. Thus, ballast resistors 42 are formed in the emitter regions 17 between the separate regions of the parts 26 of the base region 16. In the lay-out of FIG. 2C, the emitter contact openings 32 are formed in an "X" shape, and parts 26 of the base region 16 include four separate regions. The emitter regions 17 surround the parts 26. Thus, ballast resistors 43 are formed in the emitter regions 17 between the parts 26.

However, although a method for preventing latch-up employing the ballast resistor is effective in preventing the static latch-up, the method is not effective in preventing the dynamic latch-up. Although a ratio in which the stability of the device is decreased by the static latch-up is higher than that of the case in the dynamic latch-up, most of all, in a power semiconductor device in which the stability of the device is very important, destruction of the device by the dynamic latch-up cannot be disregarded. Thus, a countermeasure therefor is required.

Meanwhile, recently power semiconductor devices in which a trench process is implemented, are very important than power semiconductor devices in which the planar process is implemented. The power semiconductor device in which the trench process is implemented can be more highly integrated than a power semiconductor device in which the planar process is implemented. Also, in the power semiconductor device in which the trench process is implemented, since there is no resistance component in a parasitic junction-type field effect transistor (FET), which is an obstacle in improving the characteristics of the power semiconductor device in which the planar process is implemented, the on-resistance of the device is small. However, even in a power semiconductor device in which the trench process is implemented, there are still problems with latch-up.

In the power semiconductor device in which the trench process is implemented, there are some problems in implementing the method for preventing latch-up.

As shown in FIGS. 2A through 2C, in the power semiconductor device in which the planar process is implemented, rectangular edges of the opening 32 formed by the gate 22 are obliquely formed to have an incline of about 45°. This is to keep the distribution of a high concentration of p-type impurities in a p-type region (not shown), where the distribution is formed at the center of a cell to reduce the resistance between the base regions 16 and the emitter regions 17, constant over the entire inversion layer. But, it is not easy for the method for obliquely forming the edges of the gate 22 to be implemented in the power semiconductor device in which the trench process is implemented. This is the reason why the direction of the corners of trenches is different from that of another portions and thus, a gate oxide film is deteriorated. Accordingly, although the ballast resistor is used in the trench-gate power semiconductor device, when the resistance between the base regions 16 and the emitter regions 17 in the corners of a cell is large, this has a bad effect on prevention of latch-up of the device, and thus, improvement thereof is required.

SUMMARY OF THE INVENTION

To solve the above problems, it is an object of the present invention to provide a trench-gate power semiconductor device that prevents latch-up by employing a ballast resistor.

It is another object of the present invention to provide a method for fabricating the trench-gate semiconductor power device that prevents latch-up.

Accordingly, to achieve the above object, there is provided a trench-gate power semiconductor device. The trench-gate power semiconductor device includes a semiconductor substrate of a first conductivity type used as a collector region, a buffer layer of a second conductivity type formed on the semiconductor substrate, a drift region of a second conductivity type formed on the buffer layer, a base region of a first conductivity type formed on the drift region, a gate dielectric layer formed on the surface of a trench which is formed down to a predetermined depth into the drift region and surrounds the base region, a gate electrode formed on the gate dielectric layer, an emitter region of a second conductivity type contacting both the surface of the base region and an upper sidewall of the trench in the base region, the emitter region contains a first emitter region formed so as to be extended to a predetermined length along the sidewall of the trench and to be alternately arranged in the base region and a second emitter region extended to a predetermined length from the first emitter to the center of the base region, an emitter electrode formed so as to be electrically connected to the first emitter region through a part of the second emitter region, and a collector electrode formed so as to be electrically connected to the semiconductor substrate.

Preferably, the base region surrounded by the trench has a square shape.

Preferably, the trench-gate power semiconductor device further includes a region of a first conductivity type having a higher impurity concentration than the impurity concentration in the base region, formed so as to be overlapped with a part of the second emitter region in the base region.

Preferably, the region of the first conductivity type is a square shape surrounded by the base region, and each of the corners of the region of the first conductivity type is extended in a circle shape toward corresponding corners of the trench. Also, preferably, two diagonally opposite corners of the region of the first conductivity type are extended in a circle shape toward corresponding corners of the trench, and the other diagonally opposite corners are extended to one side of the trench and are simultaneously extended to a predetermined length along the sidewall of the trench in the base region, which is arranged along the sidewall of the trench.

In order to achieve another object, there is provided a method for fabricating a trench-gate power semiconductor device. The method comprises the steps of: a) forming a buffer layer of a second conductivity type on a semiconductor substrate of a first conductivity type; b) forming a semiconductor layer of a second conductivity type on the buffer layer; c) forming a base region of a first conductivity type and a region of a first conductivity type with high concentration from the surface of the semiconductor layer to a predetermined depth so that the base region surrounds the region of the first conductivity type with high concentration; d) forming a trench to a predetermined depth of the semiconductor layer by passing through the base region, the trench surrounds the base region; e) forming a gate dielectric layer on the surface of the trench; f) forming a gate electrode so as to fill the trench on the gate dielectric layer; g) forming an emitter region of a second conductivity type along a sidewall of the trench from the surface of the base region to a predetermined depth so that the emitter region is extended to a predetermined length along the sidewall of the trench and is alternately arranged in the base region and is extended to a predetermined length from the extended portion to the center of the base region; h) forming an emitter electrode to be electrically connected to the emitter region; and i) forming a collector electrode to be electrically connected to the semiconductor substrate.

The buffer layer and the semiconductor layer are formed by an epitaxial growth method.

Preferably, the region of the first conductivity type with high concentration is a square shape. The corners of the region of the first conductivity type with high concentration in a circle shape are extended to the trench. Also, the region of the first conductivity type with high concentration is formed in a square shape, and two diagonally opposite corners of the region are extended in a circle shape to corresponding corners of the trench, and the other diagonally opposite corners are extended to one side of the trench and are simultaneously extended to a predetermined length along the sidewall of the trench in the base region, which is arranged along the sidewall of the trench.

Preferably, the concentration of impurities in the buffer layer is higher than the impurity concentration in the semiconductor layer.

The step c) comprises the steps of: forming an oxide film for an ion implantation pad on the semiconductor layer; forming a first mask layer pattern having an opening at its center on the oxide film; implanting impurity ions of a first conductivity type by using the first mask layer pattern as an ion implantation mask; removing the first mask layer pattern; forming a second mask layer pattern having an opening surrounded by a region in which the impurity ions of a first conductivity type are implanted; implanting the impurity ions of a first conductivity type with high concentration by using the second mask layer pattern as the ion implantation mask; removing the second mask layer pattern; and forming a base region and a region of a first conductivity type with high concentration by drive-in diffusing the impurity ions of the first conductivity type.

Preferably, the emitter electrode is formed so as to directly contact an end portion of the emitter region extended to the center of the base region.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 3:
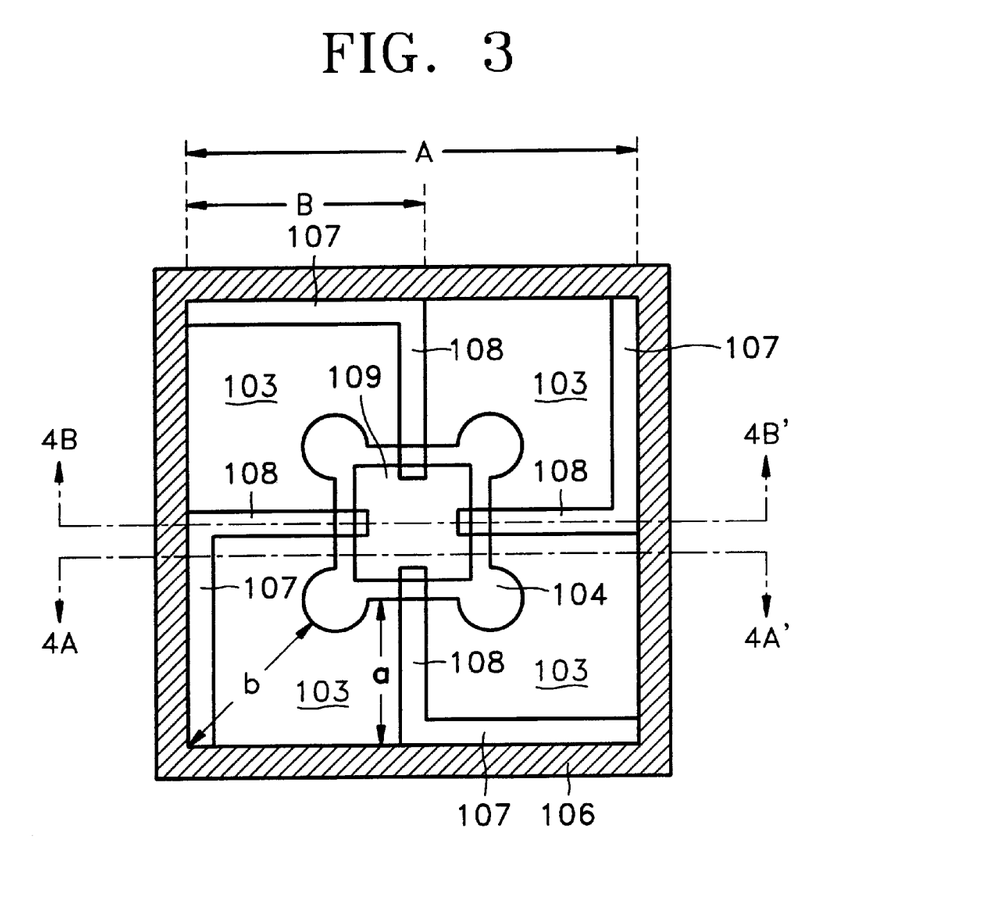
FIG. 3 is a lay-out view of a trench-gate power semiconductor device according to a first embodiment of the present invention.
Figure 4A:
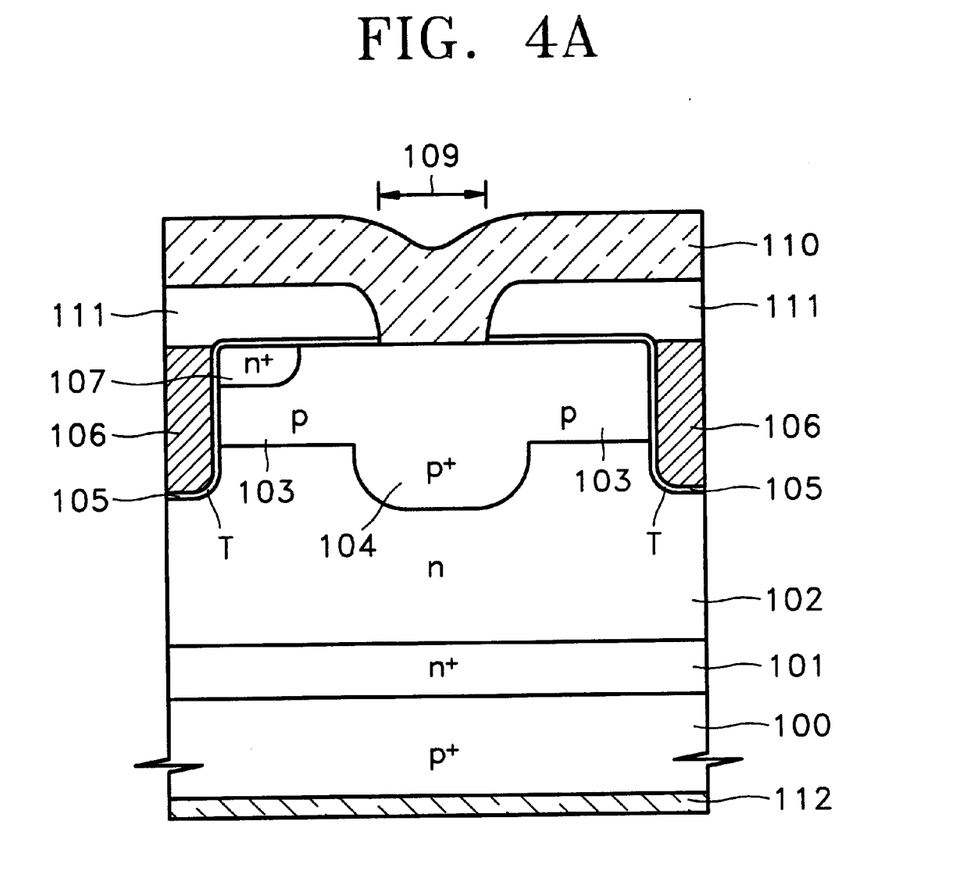
FIG. 4A is a sectional view taken along line 4A-4A' of FIG. 3.
Figure 4B:
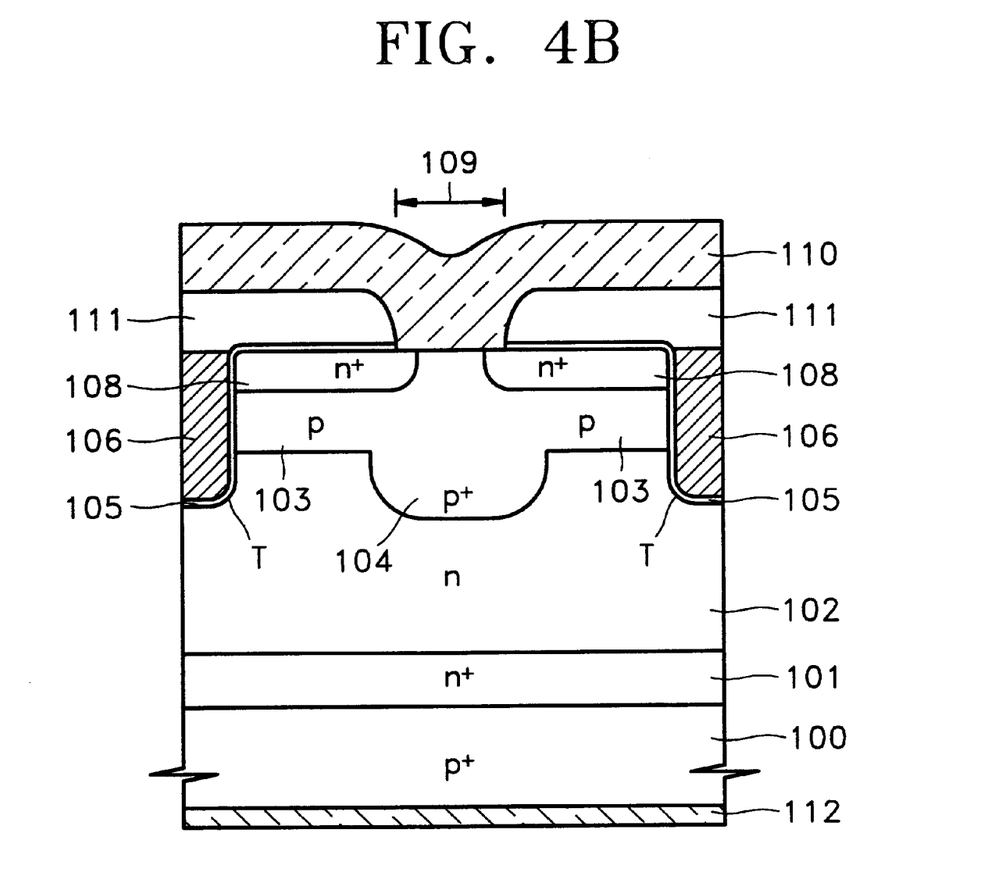
FIG. 4B is a sectional view taken along line 4B-4B' of FIG. 3.

Referring to FIGS. 3 and 4, a region having a high concentration of second conductivity type impurities, for example, an $n^+$-type buffer layer 101, is arranged on a region having a high concentration of first conductivity type impurities, for example, on a $p^+$-type semiconductor substrate 100. The $p^+$-type semiconductor substrate 100 is used as a collector region. An n-type semiconductor layer 102 used as a drift region is arranged on the buffer layer 101. The impurity concentration in the semiconductor layer 102 is lower than that in the buffer layer 101. A p-type base region 103 is arranged on the semiconductor layer 102, and a $p^+$-type region 104 is arranged at the center of the base region 103.

The base region 103 is surrounded by the trenches T which is forming down to a predetermined depth in the semiconductor layer 102, and a gate dielectric layer 105 is formed on the trenches T. A gate electrode 106 is formed on the gate dielectric layer 105.

$N^+$-type emitter regions 107 and 108 contact both the surface of the base region 103 in the base region 103 and the upper sidewalls of the trenches T and include a first emitter region 107 contacting a trench T of the trenches T at one side of the base region 103. The first emitter region 107 is formed to a predetermined length B along the sidewall of the trench T. The emitter regions 107 and 108 include a second emitter region 108 extended to a predetermined length from the first emitter region 107. The end portion of the second emitter region 108 is overlapped with a $p^+$-type region 104. Also, the end portion of the second emitter region 108 is overlapped with an emitter contact opening 109. That is, the end portion of the second emitter region 108 is exposed by the emitter contact opening 109.

An emitter electrode 110 is electrically connected to the second emitter region 108 and the $p^+$-type region 104 through the emitter contact opening 109. Since the second emitter region 108 is extended from the first emitter region 107, the emitter electrode 110 is electrically connected to the first emitter region 107. The emitter electrode 110 and the gate electrode 106 are insulated from each other by an insulating layer 111. A collector electrode 112 is electrically connected to the semiconductor substrate 100.

In the trench-gate power semiconductor device, when a voltage is applied to the gate electrode 106, an inversion layer is formed in the base region 103 along the sidewalls of the trenches T. However, there is only one first emitter region 107 which contacts only one of two trenches T formed on both sides of one base region 103, and thus, carriers move only in the inversion layer below the first emitter region 107. That is, carriers do not move in the inversion layer where there is no first emitter region 107. Thus, the occurrence of a displacement current is remarkably reduced in the inversion layer, and the occurrence of a dynamic latch-up is prevented, and thus, in general, the probability of dynamic latch-up occurring is reduced to half.

Although there is the first emitter region 107, the first emitter region 107 is connected to the emitter electrode 110 through a second emitter region 108. And then, the distance that the carriers move through the emitter regions 107 and 108 is increased. This has an emitter ballast effect for preventing the junction between the emitter regions 107 and 108 and the base region 103 from being forward biased, by moving the carriers (for example, holes) through the base region 103 under the emitter regions 107 and 108, and then, this also has an effect for preventing a static latch-up.

Also, as evident from FIG. 3, the $p^+$-type region 104 is formed in a square shape, the corners of which are formed in an extended circle shape. This means that the base region 103 is reduced to a circle shape in the corners of the $p^+$-type region 104. That is, a vertical distance a from the sidewalls of the trenches T for defining inside rectangular active regions to the nearest side of the rectangular $p^+$-type region 104 and a diagonal distance b from the corners of the trenches T to the nearest corner of the $p^+$-type region 104 are the same. Since the distance between the $p^+$-type region 104 and the trenches T is almost the same in all areas, as a result, there is no portion in which the resistance between a base and an emitter of a parasitic transistor is particularly increased, latch-up, which occurs due to the portion having a large resistance between the base and the emitter of the parasitic transistor, can be prevented.

Figure 5:
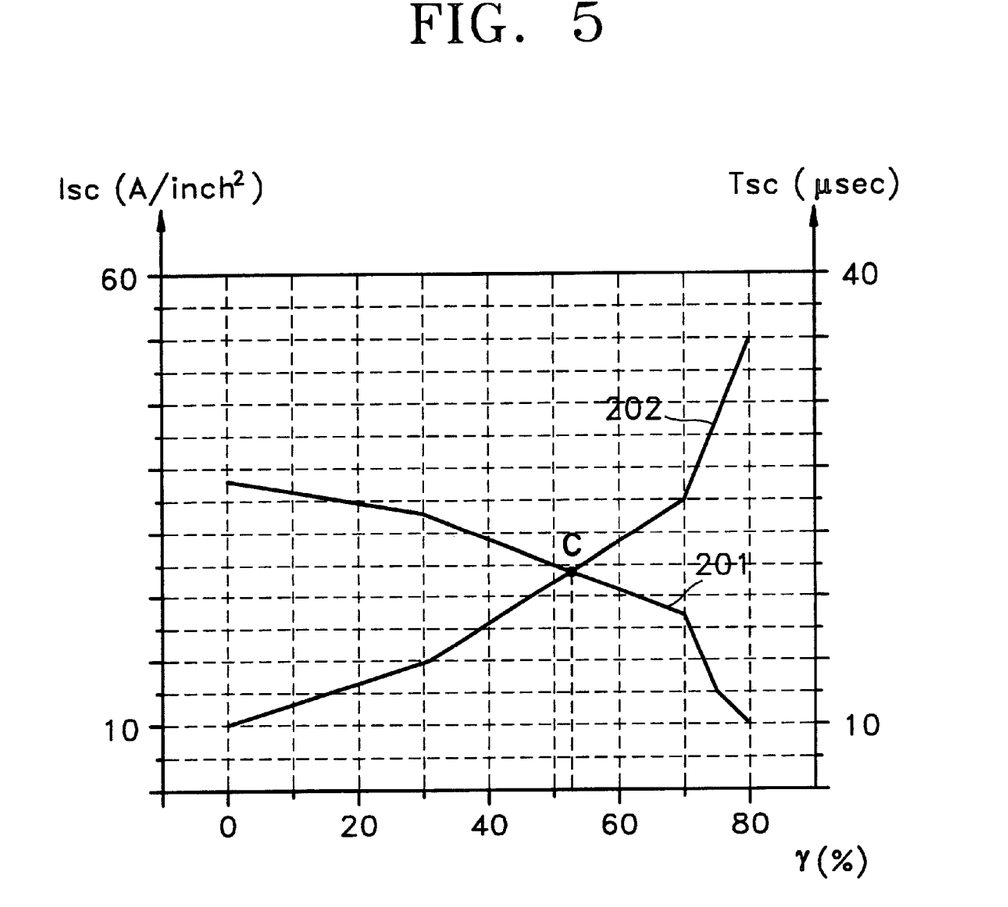
FIG. 5 is a graph illustrating a short circuit current and a short circuit time with respect to a relative ratio of the length of an inversion layer in the trench-gate power semiconductor device according to the present invention and the length of an inversion layer above which there is no first emitter region.

FIG. 5 is a graph illustrating a short circuit current $I_{sc}$ and a short circuit time $T_{sc}$ with respect to a relative ratio $\gamma$ of the length of an inversion layer in the trench-gate power semiconductor device according to the present invention and the length of the inversion layer in which there is no first emitter region.

Here, a relative ratio $\gamma$ of the length of the inversion layer and the length of the inversion layer in which there is no first emitter region is expressed by Equation 1.

$$\gamma = \frac{A - B}{A} \times 100 \qquad \text{[Equation 1]}$$

Here, A is the length of the inversion layer formed along the sidewalls of the trenches T, and B is the length of the first emitter region 107 formed along the sidewalls of the trenches T (see FIG. 3).

Meanwhile, the short circuit current $I_{sc}$ is a current value when a device lives in a no-load state and when the voltage applied to the gate electrode 106 is the device's rated voltage, and the short circuit time $T_{sc}$ is a time when the device lives in a no-load state and when the voltage applied to the gate electrode 106 is the device's rated voltage.

As evident from FIG. 5, the larger the relative ratio $\gamma$ of the length of the inversion layer and the length of the inversion layer in which there is no first emitter region is, the smaller the short circuit current $I_{sc}$ is, and the larger the short circuit time $T_{sc}$ is. Thus, the short circuit current $I_{sc}$ and the short circuit time $T_{sc}$ have a trade off relation with each other. Thus, a desirable value of the relative ratio $\gamma$ of the length of the inversion layer and the length of the inversion layer in which there is no first emitter region, is found at a point C where a curve 201 of the short circuit current $I_{sc}$ and a curve 202 of the short circuit time $T_{sc}$ are congruent with each other.

Figure 6:
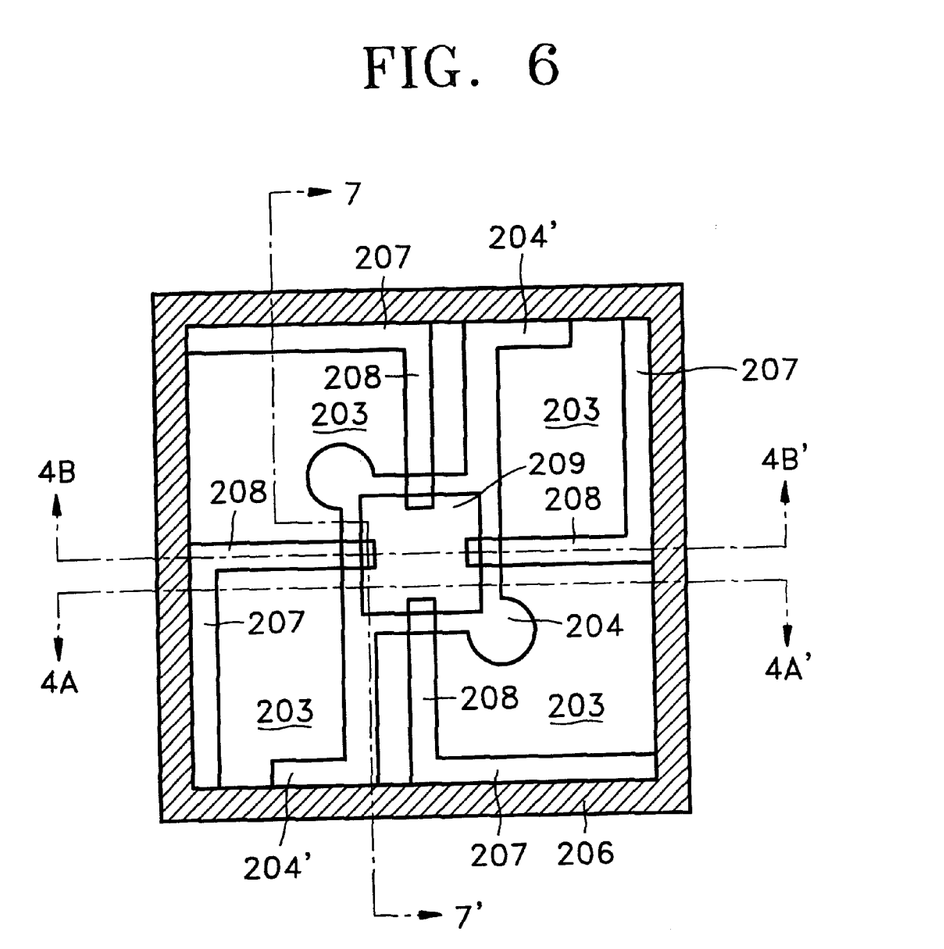
FIG. 6 is a lay-out view of the trench-gate power semiconductor device according to a second embodiment of the present invention.
Figure 7:
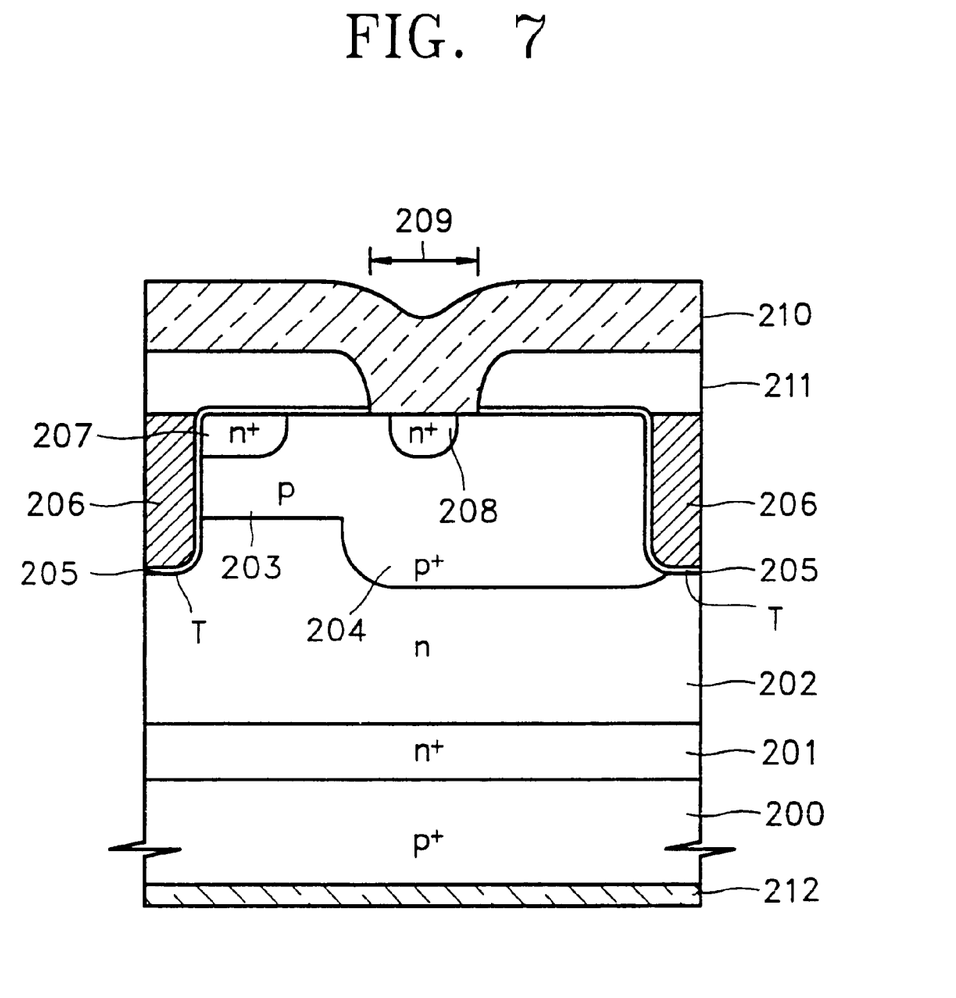
FIG. 7 is a sectional view taken along line 7-7' of FIG. 6.

Referring to FIGS. 6 and 7, a region having a high concentration of second conductivity type impurities, for example, an n$^+$-type buffer layer 201, is arranged on a region having a high concentration of first conductivity type impurities, for example, on a p$^+$-type semiconductor substrate 200. The p$^+$-type semiconductor substrate 200 is used as a collector region. An n-type semiconductor layer 202 used as a drift region is arranged on the buffer layer 201. The impurity concentration in the semiconductor layer 202 is lower than that in the buffer layer 201. A p-type base region 203 is arranged on the semiconductor layer 202, and a p$^+$-type region 204 is arranged at the center of the base region 203.

The base regions 203 is surrounded by the trenches T which is forming down to a predetermined depth in the semiconductor layer 202, and a gate dielectric layer 205 is formed on the trenches T. A gate electrode 206 is formed on the gate dielectric layer 205.

N$^+$-type emitter regions 207 and 208 contact both the surface of the base region 203 in the base region 203 and the upper sidewalls of the trenches T and include a first emitter region 207 contacting a trench T of the trenches T at one side of the base region 203. The first emitter region 207 is formed to a predetermined length along the sidewall of the trench T. The emitter regions 207 and 208 include a second emitter region 208 extended to a predetermined length from the first emitter region 207. The end portion of the second emitter region 208 is overlapped with a p$^+$-type region 204. Also, the end portion of the second emitter region 208 is overlapped with an emitter contact opening 209. That is, the end portion of the second emitter region 208 is exposed by the emitter contact opening 209.

An emitter electrode 210 is electrically connected to the second emitter region 208 and the p$^+$-type region 204 through the emitter contact opening 209. Since the second emitter region 208 is extended from the first emitter region 207, the emitter electrode 210 is electrically connected to the first emitter region 207. The emitter electrode 210 and the gate electrode 206 are insulated from each other by an insulating layer 211. A collector electrode 212 is electrically connected to the semiconductor substrate 200.

Meanwhile, the p$^+$-type regions 204 and 204' are formed in a predetermined portion in the base region 203. The p$^+$-type regions 204 and 204' are formed in a square shape, two diagonally opposite corners of which are extended in a circle shape. Also, the p$^+$-type regions 204 and 204' include the second p$^+$-type region 204' in a curved stripe shape which is extended to the sidewalls of the trenches T from the corners of the p$^+$-type region 204 that are not extended in a circle shape. Thus, the first emitter region 207 and the second p$^+$-type region 204' are arranged to be spaced-apart from each other along the sidewalls of the trenches T for defining inside rectangular active regions.

When a voltage is applied to the gate electrode 206, an inversion layer formed in the base region 203 along the sidewalls of the trenches T is formed only around a part of the sidewalls of the trenches T. That is, since the second p$^+$-type region 204' has a high impurity concentration, the inversion layer formed in the base region 203 along the sidewalls of the trenches T is not formed in a portion in which the second p$^+$-type region 204' exists.

Likewise, since the inversion layer is formed only in a portion in the base region 203 along the sidewalls of the trenches T, and the inversion layer is not formed in the portion in which the second p$^+$-type region 204' is formed along the sidewalls of the trenches T, the probability that a static latch-up will occur is less than in the case where the second p$^+$-type region 204' does not exist.

As in the first embodiment, since there is only one first emitter region 207 which contacts only one of two trenches T formed on both sides of one base region 203, carriers move only in the inversion layer in which the first emitter region 207 exists, and carriers do not move in the inversion layer in which the first emitter region 207 does not exist. Thus, the occurrence of a displacement current is remarkably reduced in the inversion layer, as a result, the occurrence of a dynamic latch-up is suppressed, and thus, in general, the probability that the dynamic latch-up will occur is also reduced to half.

Although there is the first emitter region 207, the first emitter region 207 is connected to the emitter electrode 210 through a second emitter region 208. And then, the distance that the carriers move through the emitter regions 207 and 208 is increased. This has an emitter ballast effect for preventing the junction between the emitter regions 207 and 208 and the base region 203 from being forward biased, by moving the carriers (for example, holes) through the base region 203 under the emitter regions 207 and 208, and then, a static latch-up can be more effective prevented.

Meanwhile, as evident from FIG. 6, the part of corners of the first p$^+$-type region 204 is formed in a square shape and the other part of the corners is extended to the second p$^+$-type region 204', and the rectangular corners are formed in an extended circle shape. This means that the distance between the p$^+$-type region 104 and the trenches T is almost the same in all areas, as a result, there is no portion in which the resistance between a base and an emitter of a parasitic transistor is particularly increased, latch-up, which occurs due to the portion having a large resistance between the base and the emitter of the parasitic transistor, can be prevented.

Figure 8:
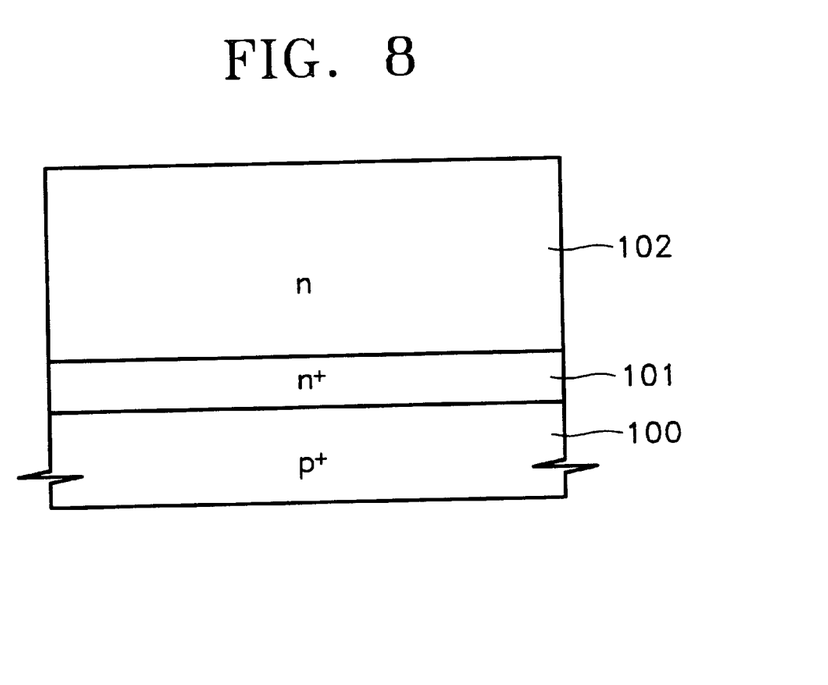
FIGS. 8 through 14, 15A and 15B are diagrams illustrating a method for fabricating the trench-gate power semiconductor device according to the first embodiment of the present invention.

Referring to FIG. 8, an n$^+$-type buffer layer 101 is formed on a p$^+$-type semiconductor substrate 100 to be used as a collector region. Resistivity of the semiconductor substrate 100 is about 0.005 to 0.5 Ωcm, and resistivity of the buffer layer 101 is about 0.06 to 0.2 Ωcm. Subsequently, a semiconductor layer 102 to be used as a drift region is formed on the buffer layer 101. The semiconductor layer 102 can be formed by using an epitaxial growth method.

Figure 9:
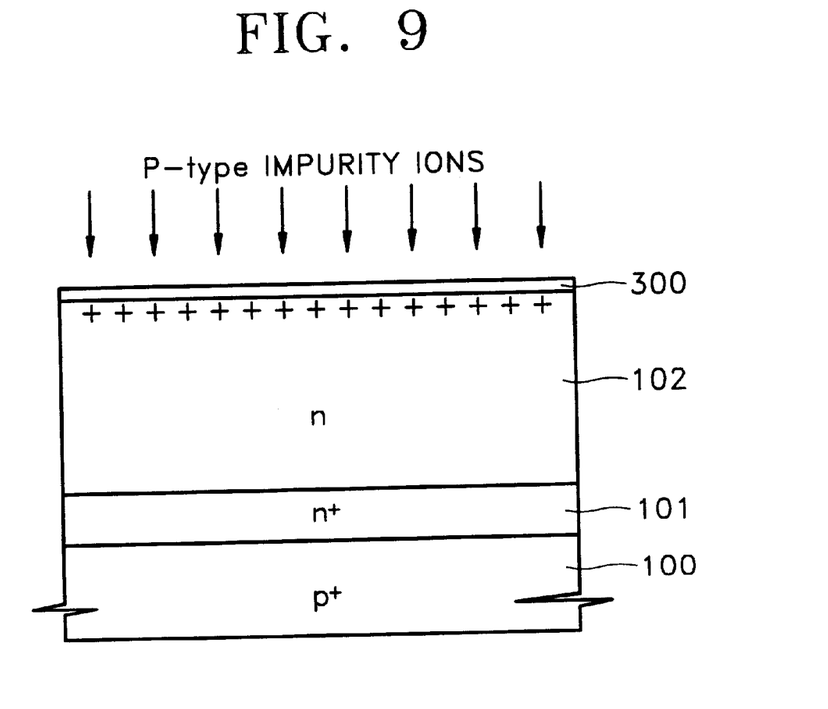

Next, referring to FIG. 9, p-type impurity ions are implanted on the semiconductor layer 102 after forming an oxide film 300 about 600–1000Å thick for an ion implantation pad.

Figure 10:
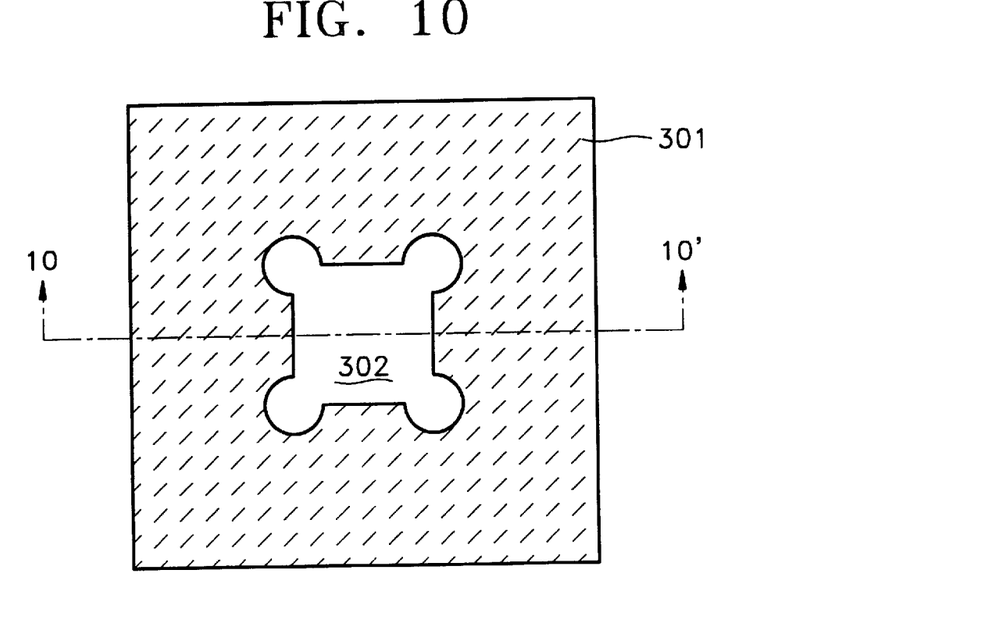
Figure 11:
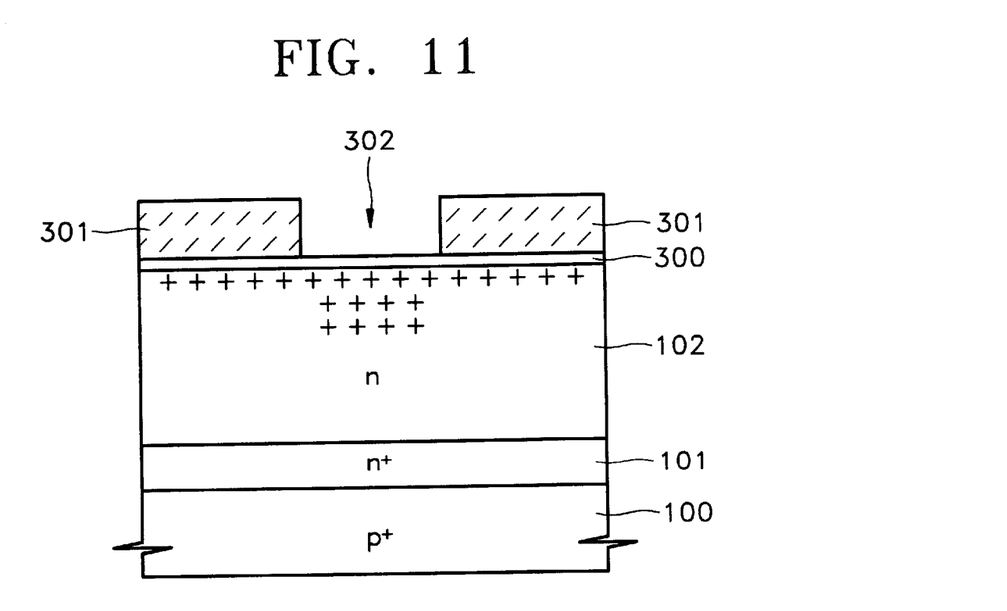

Next, referring to FIGS. 10 and 11, p-type impurity ions with high concentration are implanted at the center of a cell using a given mask layer pattern 301. Here, a photoresist layer pattern can be used as the mask layer pattern 301, and the used mask layer pattern 301 has an opening 302 which is in a square shape and whose corners are extended in a circle shape.

Figure 12:
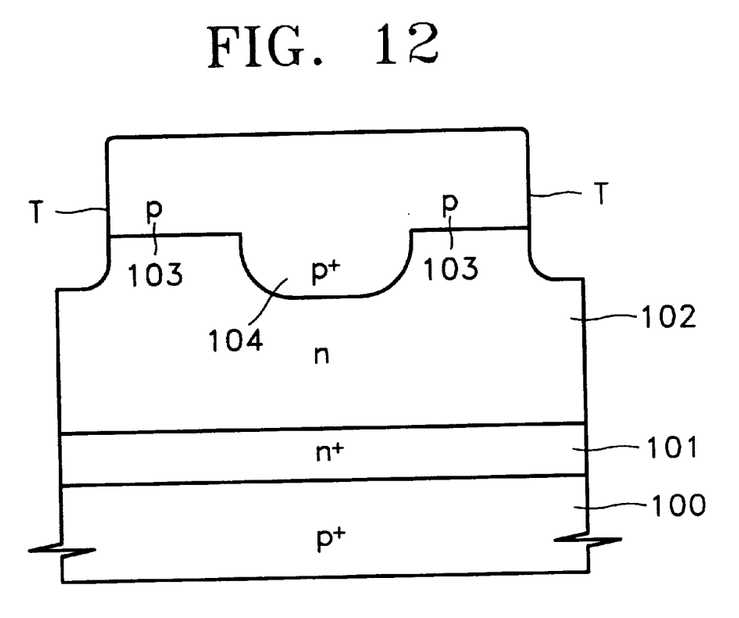

Next, referring to FIG. 12, a p-type base region 103 and a p$^+$-type region 104 are formed by drive-in diffusing the implanted p-type impurity ions. Subsequently, trenches T are formed via conventional lithography and etching processes after removing the oxide film 300. A base region is located in a region surrounded by the trenches T by the lithography and etching processes, and a p$^+$-type region 104 is located at the center of the base region 103. The bottoms of the trenches T are located in a predetermined depth of a semiconductor layer 102 through the base region 103. After forming the trenches T, conventional sacrificial oxidation and cleaning processes are performed to remove defects and impurities occurred during the etching process for forming the trenches T.

Figure 13:
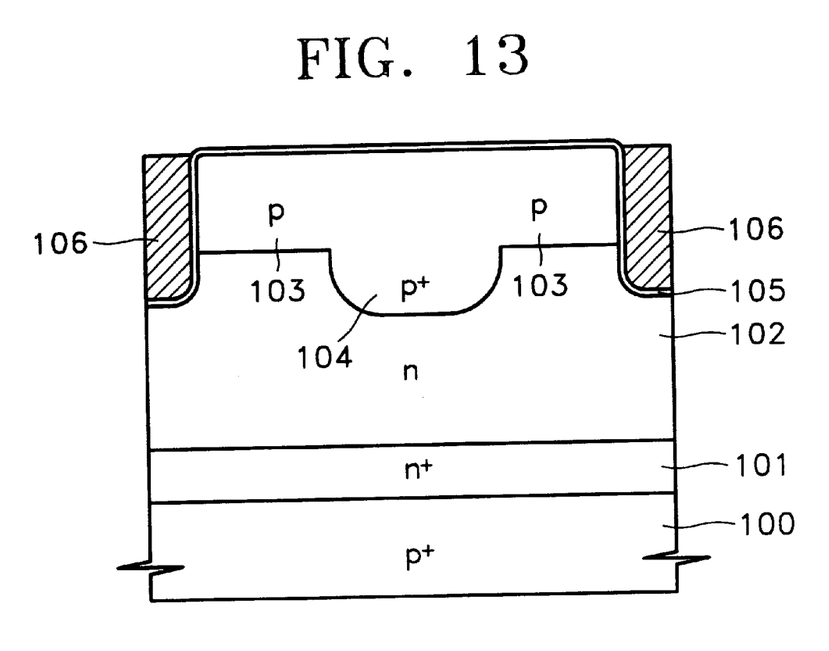

Next, referring to FIG. 13, a gate electrode 106 is formed so as to fill the trenches T after forming a gate oxide film 105 on the inside surface of the trenches T. In order to form the gate electrode 106, first, a conductive layer, for example, a polysilicon layer (not shown) is formed on the entire surface of the structure in which the gate oxide film 105 is formed. Here, the inside of the trenches T is fully filled by the polysilicon layer. Subsequently, other polysilicon layers (not shown) excepting a polysilicon layer (not shown) for a gate electrode that fills the trenched T are removed by performing the conventional lithography and etching processes. Although not shown, a polysilicon layer to be used as a floating electrode of the polysilicon layers is not removed.

Figure 14:
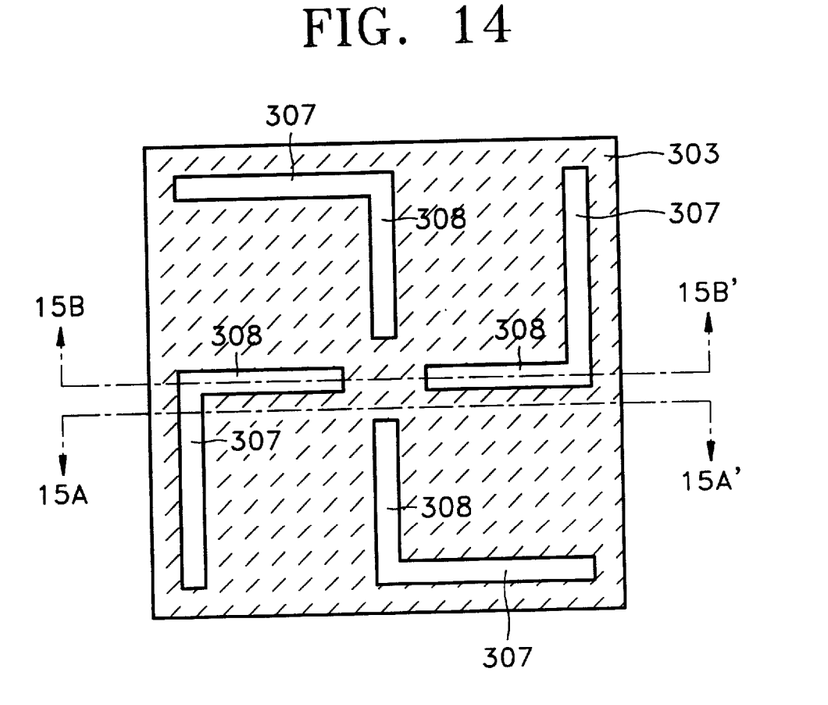
Figure 15A:
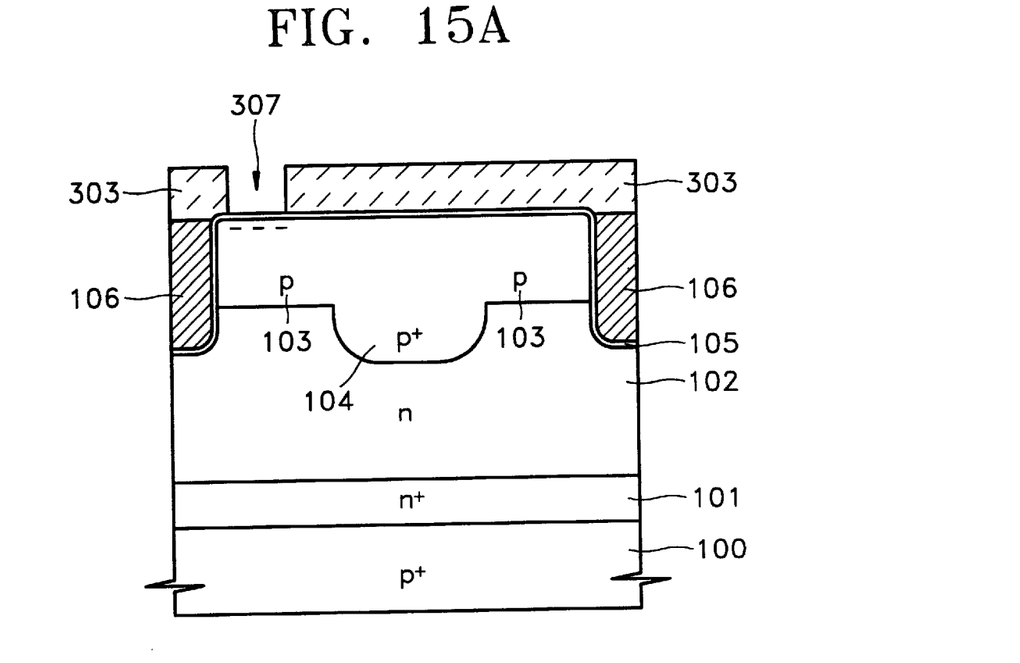
Figure 15B:
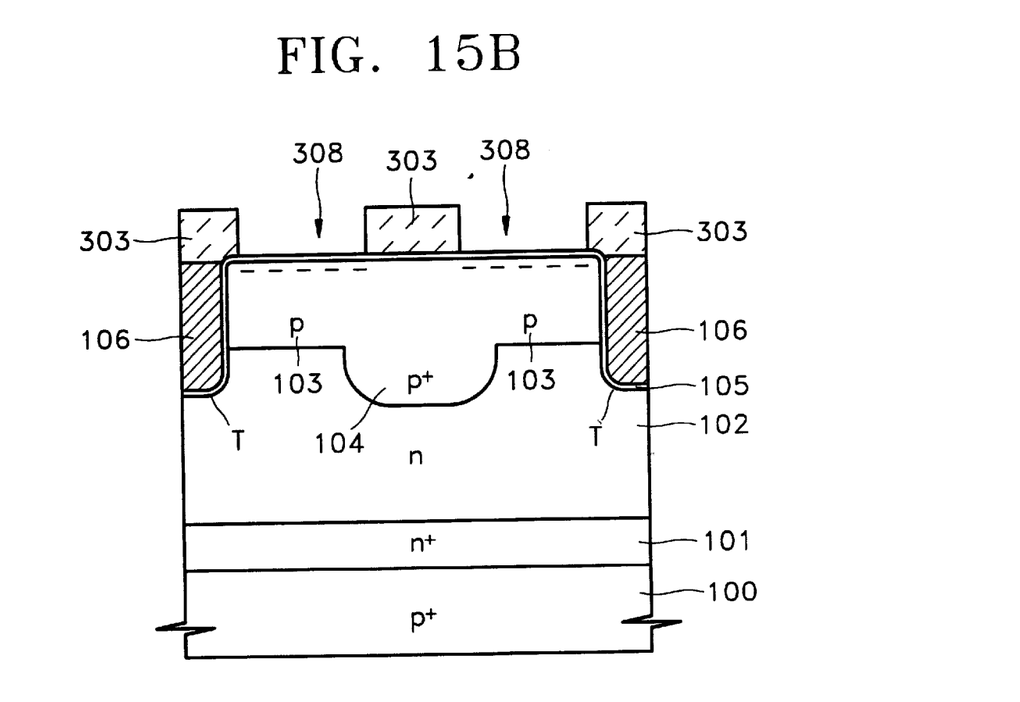

Next, referring to FIGS. 14 and 15, a mask layer pattern 303 is formed on the entire surface of the result of FIG. 13. The mask layer patterns 303 have four separated openings and include opened portions so that each of the openings may form a first emitter region and a second emitter region. That is, the openings include a first opening 307 formed so as to open a base region 103 along sidewalls of the trenches T and a second opening 308 formed so as to be extended to the center of a cell from the first opening 307 in order to form the second emitter region. Subsequently, n-type impurity ions with high concentration are implanted using the mask layer pattern 303 as an ion implantation mask.

As shown in FIGS. 3 and 4, the mask layer pattern 303 is removed, and emitter regions 107 and 108 comprising an n$^+$-type first emitter region 107 and a second emitter region 108 are formed by drive-in diffusing the implanted n-type impurity ions. Subsequently, an emitter electrode 110 is formed so as to be insulated from a gate electrode 106 and to be connected to the second emitter region 108, and then, a collector electrode 112 is formed so as to be connected to a semiconductor substrate 100. As a result, a trench-gate power semiconductor device according to the present invention is completed.

Figure 16:
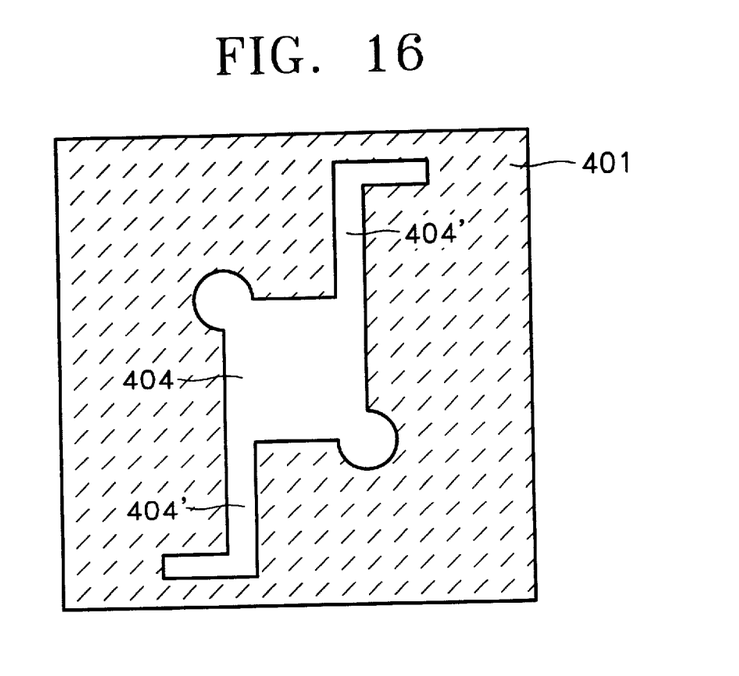
FIG. 16 is a diagram illustrating a method for fabricating the trench-gate power semiconductor device according to the second embodiment of the present invention.

FIG. 16 is a diagram illustrating a method for fabricating the trench-gate power semiconductor device according to the second embodiment of the present invention. The second embodiment of the present invention is the same as the method for fabricating the trench-gate power semiconductor device according to the first embodiment of the present invention shown in FIGS. 8 through 15 except that the shape of the mask layer pattern used in an ion implantation for forming a p$^+$-type region is different from that of the mask layer pattern (see 301 of FIGS. 10 and 11) used in the ion implantation for forming the p$^+$-type region shown in FIGS. 10 and 11. Thus, the above description will not be repeated.

Referring to FIG. 16, a mask layer pattern 401 used in an ion implantation for forming a p$^+$-type region is in a square shape, and a part of their corners includes a first open region 404 in an extended circle shape and a second open region 404' in a curved stripe shape extended along sidewalls of trenches after being extended near the sidewalls of the trenches from the corners that are not extended to a circle. A roundly-extended portion of the first open region 404 is formed in opposite corners, and the second open region 404' is also formed from the opposite corners, respectively. When a drive-in diffusion process is performed after implanting p-type impurity ions by using the mask layer pattern 401 as a mask, p$^+$-type regions 204 and 204' as shown in FIGS. 6 and 7, are formed. The following process is as described referring to FIGS. 12 through 15.

As described above, according to the present invention, since the emitter region and the base region are alternately arranged in a portion where the inversion layer is formed along the sidewalls of the trenches, the occurrence of a displacement current in a portion where there is the base region can be remarkably reduced, and thus, the dynamic latch-up can be prevented. Since the emitter region includes the first emitter region formed along the sidewalls of the trenches and the second emitter region extended to a portion connected to the emitter electrode from the emitter region, the static latch-up by the ballast resistor can be prevented. Further, a high-concentration region is arranged in a part of the base region formed along the sidewalls of the trenches, and thus, the inversion layer is not formed in the portion, as a result, the probability of the static latch-up occurring is further reduced.

While this invention has been particularly shown and described with references to preferred embodiments of an insulated gate bipolar transistor, it will be understood by those skilled in the art that various changes in form and details may be made therein without departing from the spirit and scope of the invention as defined by the appended claims. For example, in case of a power MOSFET, if a conductivity type of a semiconductor substrate is formed reversely to the conductivity type of the insulated gate bipolar transistor, it is possible for the same structure and method according to the present invention to be applied in the power MOSFET.

What is claimed is:

1. A trench-gate power semiconductor device comprising:
   a semiconductor substrate of a first conductivity type used as a collector region;
   a buffer layer of a second conductivity type formed on the semiconductor substrate;
   a drift region of a second conductivity type formed on the buffer layer;
   a base region of a first conductivity type formed on the drift region;
   a gate dielectric layer formed on the surface of a trench which is formed down to a predetermined depth into the drift region and surrounds the base region;
   a gate electrode formed on the gate dielectric layer;
   an emitter region of a second conductivity type contacting both the surface of the base region and an upper sidewall of the trench in the base region, the emitter region contains a first emitter region formed so as to be extended to a predetermined length along the sidewall of the trench and to be alternately arranged in the base region and a second emitter region extended to a predetermined length from the first emitter to the center of the base region;
   an emitter electrode formed so as to be electrically connected to the first emitter region through a part of the second emitter region;
   a collector electrode formed so as to be electrically connected to the semiconductor substrate; and
   a first region of a first conductivity type having a higher impurity concentration than the impurity concentration in the base region, formed so as to be overlapped with a part of the second emitter region in the base region,
   wherein the first region of the first conductivity type is a square shape surrounded by the base region, and
   each of the corners of the first region of the first conductivity type is extended in a circle shape toward corresponding corners of the trench.

2. The trench-gate power semiconductor device according to claim 1, wherein the base region surrounded by the trench has a square shape.

3. The trench-gate power semiconductor device according to claim 1, wherein the first conductivity type is p-type impurities, and the second conductivity type is n-type impurities.

4. A trench-gate power semiconductor device comprising:
   a semiconductor substrate of a first conductivity type used as a collector region;
   a buffer layer of a second conductivity type formed on the semiconductor substrate;
   a drift region of a second conductivity type formed on the buffer layer;
   a base region of a first conductivity type formed on the drift region;
   a gate dielectric layer formed on the surface of a trench which is formed down to a predetermined depth into the drift region and surrounds the base region;
   a gate electrode formed on the gate dielectric layer;
   an emitter region of a second conductivity type contacting both the surface of the base region and an upper sidewall of the trench in the base region, the emitter region contains a first emitter region formed so as to be extended to a predetermined length along the sidewall of the trench and to be alternately arranged in the base region and a second emitter region extended to a predetermined length from the first emitter to the center of the base region;
   an emitter electrode formed so as to be electrically connected to the first emitter region through a part of the second emitter region;
   a collector electrode formed so as to be electrically connected to the semiconductor substrate; and
   a first region of a first conductivity type having a higher impurity concentration than the impurity concentration in the base region, formed so as to be overlapped with a part of the second emitter region in the base region,
   wherein the first region of the first conductivity type is a square shape surrounded by the base region, and
   two diagonally opposite corners of the first region of the first conductivity type are extended in a circle shape toward corresponding corners of the trench, and the other diagonally opposite corners are extended to one side of the trench and are simultaneously extended to a predetermined length along the sidewall of the trench in the base region, which is arranged along the sidewall of the trench.

5. The trench-gate power semiconductor device according to claim 4, wherein the base region surrounded by the trench has a square shape.

6. The trench-gate power semiconductor device according to claim 4, wherein the first conductivity type is p-type impurities, and the second conductivity type is n-type impurities.

* * * * *